United States Patent [19]
Iizuka et al.

[11] Patent Number: 4,641,165
[45] Date of Patent: Feb. 3, 1987

[54] DYNAMIC MEMORY DEVICE WITH AN RC CIRCUIT FOR INHIBITING THE EFFECTS OF ALPHA PARTICLE RADIATION

[75] Inventors: Tetsuya Iizuka; Syuso Fujii, both of Kawasaki; Yukimasa Uchida, Yokohama, all of Japan

[73] Assignee: Tokyo Shibaura Denki Kabushiki Kaisha, Japan

[21] Appl. No.: 475,554

[22] Filed: Mar. 15, 1983

[30] Foreign Application Priority Data

| Apr. 28, 1982 | [JP] | Japan | 57-70403 |
| May 21, 1982 | [JP] | Japan | 57-85742 |
| May 21, 1982 | [JP] | Japan | 57-85743 |
| May 21, 1982 | [JP] | Japan | 57-85744 |

[51] Int. Cl.$^4$ .......................................... H01L 27/14
[52] U.S. Cl. ..................... 357/23.6; 357/29; 357/41; 357/51; 357/84; 365/149
[58] Field of Search ............... 357/23.6, 84, 29, 41, 357/51, 29, 41, 51, 84; 365/149

[56] References Cited

U.S. PATENT DOCUMENTS

| 4,060,796 | 11/1977 | Togei et al. | 357/23.6 |
| 4,112,575 | 9/1978 | Fu et al. | 357/23.6 |
| 4,115,871 | 9/1978 | Varadi | 357/23.6 |
| 4,156,939 | 5/1979 | Takemae et al. | 357/41 |
| 4,164,751 | 8/1979 | Tasch, Jr. | 357/23.6 |
| 4,184,085 | 1/1980 | Takahashi | 357/23.6 |
| 4,240,195 | 12/1980 | Clemens et al. | 357/23.6 |
| 4,271,420 | 6/1981 | Chikamura et al. | 357/41 |
| 4,419,743 | 12/1983 | Taguchi et al. | 357/23.6 |

OTHER PUBLICATIONS

Hu, "Alpha-Particle-Induced Field and Enhanced Collections of Carriers" *IEEE Elec. Dev. Lett*, Vol. EDL-3, No. 2, Feb. 1982.

Hsieh et al., "A-Field-Funnelling Effect on the Collection of Alpha-Particle-Generated Carriers in Silicon Devices", *IEEE Elec. Dev. Letts.*, vol. EDL-2, No. 4, Apr. 1981.

*Primary Examiner*—Andrew J. James
*Assistant Examiner*—Charles S. Small, Jr.
*Attorney, Agent, or Firm*—Banner, Birch, McKie & Beckett

[57] ABSTRACT

The dynamic memory device of the present invention is formed on an integrated semiconductor substrate subjected to alpha radiation and comprises a switching transistor having a switching terminal, an input-output terminal and a memory terminal; a bit line couple to said input-output terminal for supplying a charge to said transistor; a word line coupled to said switching terminal for controlling the switching of said transistor; and, an R-C circuit coupled to the memory terminal and comprising a charge storage capacitor for storing the charge supplied from said bit line and for substantially preventing loss of the stored charge due to particle radiation.

20 Claims, 22 Drawing Figures

DYNAMIC MEMORY DEVICE WITH AN RC CIRCUIT FOR INHIBITING THE EFFECTS OF ALPHA PARTICLE RADIATION

BACKGROUND OF THE INVENTION

This invention relates to semiconductor memory devices and in particular to a dynamic memory device which substantially prevents soft errors caused by alpha particle radiation.

As the semiconductor industry is continuing the trend toward higher levels of integration in memory circuits the presence of soft errors have become prevalent due to the passage of heavily-ionized radiation through the memory array area and resulting in the loss of stored data. When an alpha particle penetrates the surface of the memory substrate, it can create enough electron hole pairs near a storage node to cause a random, single bit error (i.e., soft error). These errors are caused by a substantial loss of stored charge in the memory storage capacitor of the semiconductor device. At smaller levels of integration (.e.g., 16K bit memories and smaller) the effect of alpha particle radiation on the stored charge is negligible since each capacitor maintains a relatively large capacitance and, thereby, a large charge. At higher levels of integration, however, the area of the storage capacitor is smaller which thereby reduces its capacitance; thus, the effect of radiation can appreciable effect the smaller stored charge and result in a change in the binary state of the memory.

This problem is particularly acute in dynamic memories since each memory circuit comprises two elements including a single switching transistor and a charge storage capacitor. As a result, there is no means available to draw off the excess charge created by the radiation. Generally, static memories, on the other hand, incorporate six elements including two switching transistors having opposite states. Consequently, the additional charge created by the radiation may be drained off by the on transistor. At higher integration levels, however, static memory can also be adversely effected by radiation due to its higher density of components.

The prior art has attempted to mitigate soft error problems by various techniques. One technique increases the storage density of the charge storage memory capacitor by either making the gate oxide thinner or changing the composition of gate oxide to increase its dielectric constant. Making the gate oxide thinner, however, increases the electric field thereby producing breakdown and associated reliability problems. Moreover, changing the composition of the gate oxide is likewise ineffective since other compositions are not as reliable as $SiO_2$ and, at best, can only produce a small change in storage density. In any event, the purity of other compositions are still unknown and require further investigation and development.

Another prior art technique utilizes a sensor amplifier coupled to the memory device and having improved sensitivity. By increasing the signal-to-noise ratio of the amplifier it can detect signal changes produced by the radiation. Such an amplifier, however, is impractical to construct since the S/N ratio is limited as the integration level increases. Furthermore, at larger integration levels the noise level increases.

A further prior art technique utilizes chip coating. With this method, the memory chip is coated with a contamination-free organic material such as a polyimide resin. This technique, however, does not prevent radiation which is generated by the chip composition itself and impurities within the chip package. Moreover, the process of chip coating is costly and time consuming. While the industry has attempted to improve the purity of the chip itself and its packaging these attempts have been impractical.

The problems of the prior art memory devices discussed above will be explained with reference to FIGS. 1-3.

Conventionally, dynamic type memory devices have been designed by arranging unit memory cells in the form of a matrix as shown in FIG. 1. That is, a switching MOS transistor $Q_1$ and a capacitor C are connected in series between a bit line BL and a power supply $P_O$; the gate electrode of transistor $Q_1$ is connected to a word line WL. The particular switching transistor of the unit memory cell which is selected by the word and bit line turns ON, so that a charge is stored in the capacitor which performs the memory operation. The stored charge is subsequently read out on the bit line via the switching transistor.

FIG. 2 shows a plane view of the pattern layout of the circuit of FIG. 1, wherein one unit cell is surrounded by a dot-dashed line 11. In the drawing $WL_1$ and $WL_2$ are word lines formed by a low resistance wiring layer. $BL_1$ and $BL_2$ are bit lines formed by, for example, an aluminum wiring layer, and $C_G$ is a low resistance layer for forming an opposite electrode of the capacitor. Switching MOS transistor and MOS capacitor are represented by broken lines 12 and 13, respectively.

In an n-channel dynamic memory device formed on p-type semiconductor substrate, it is important to determine whether many electrons are present at a memory node N or whether a few electrons are present at node N; the first condition corresponds to a "0" (low level) and the second condition corresponds to a "1" (high level). The evaluation of the stored information ("1", "0") is accomplished by comparing the charge read out on the bit line with a reference charge of a dummy cell by utilizing a sensor amplifier. Usually, the memory node N comprises a n-type diffused region wherein an opposite electrode P is connected to a power supply potential and the MOS capacitor is formed between the opposite electrode P and the node N.

Since the dynamic memory device described above stores information by storing a charge in the capacitor, an erroneous reading can occur if the stored charge is lost by undesired leakage. Particularly, as discussed above, such erroneous readings are termed soft errors and are caused by alpha-radiation. In the circuit configuration shown in FIGS. 1 and 2, the quantity of the charge stored in the capacitor is decreased as the circuit is constructed at higher integration densities. Therefore, the memory content is easily destroyed when alpha-particles impinge the semiconductor substrate. As shown in FIG. 3, the alpha-rays applied to the semiconductor substrate 14 through its package generate a large number of electron-hole pairs along the trajectory of the radiation. As a result, the total quantity of the change caused by the radiation is in the order of 100 fC (femtocoulomb = $10^{-15}$ C). Within the generated carriers, electrons with high mobility are likely to be collected if an n-type region 15 formed in substrate 14 is positioned along the trajectory of the radiation.

On the one hand, it is known that the carriers generated by alpha-rays are collected during an extremely short time period. When alpha-rays α impinge an n-type region 15, formed in a p-type substrate 14, the current waveform of the generated electrons flowing into region 15 is represented by a pulse current having a narrow pulse width as shown in FIG. 4. The continuous time $t_d$ (i.e., 0.2 to 0.3 n sec) of the pulse current is sufficiently short as compared with the internal node time constant of the LSI. During this time, since a large number of electron-hole pairs are produced along the trajectory of the radiation, the electrical conductivity increases near the trajectory and the carriers are collected at the n-type region 15 along the trajectory. This is called funnelling effect. Since the electron-hole pairs are freely diffused into the semiconductor substrate 14, the high conductivity zone disappears after the time $t_d$ (hereinafter referred to as the funnelling time constant). Therefore, it is difficult to collect the carriers.

With respect to the memory cell, the memory node N is a n-type region, and if a "1" is stored, the electrons flow easily into the n-type region because the potential is low. Consequently, a malfunction occurs whereby a stored "1" becomes a "0". In conventional devices, the memory node capacitance is in the order of 40 fF, and the quantity of charge to be stored is 200 fC (40 fF×5 V) assuming the power supply voltage is 5 V. Since the total quantity of charge generated by the incident radiation is in the order of 100 fC, in the generated charge reaches ½ of the memory node capacitance. Accordingly, the likelihood that the memory content will be destroyed by carriers due to alpha-radiation is increased. In order to reduce the soft error rate, it has become necessary, for example, to increase the memory node capacitance to a sufficiently large value to neglect the influence of carriers caused by alpha-rays. However, as discussed above, increasing the capacitance produces serious problems if high integration density is desired.

SUMMARY OF THE INVENTION

An object of this invention is to provide a dynamic memory device for preventing soft-errors due to alpha-particles and the like.

A further object of this invention is to provide a dynamic memory device permitting high component density.

Another object of this invention is to provide a dynamic memory device, which is superior in reliability and design flexibility.

A further object of the invention is to provide simple method for eliminating soft errors without the time consuming and costly procedures employed in the prior art.

A still further object of the present invention is to provide a method of eliminating soft errors without changing the gate oxide composition or thickness and avoiding the problems associated therewith.

A still further object of the present invention is to eliminate soft errors despite the presence of radiation generating impurities in the chip itself and its packaging.

In order to achieve the above objects, the dynamic memory device of this invention comprises a switching transistor having a switching terminal, an input-output terminal and a memory terminal; a bit line coupled to said input-output terminal for supplying a charge to said transistor; a word line coupled to said switching terminal for controlling the switching of said transistor; and, an R-C circuit means coupled to said memory terminal and comprising a charge storage capacitor for storing the charge supplied from said bit line and for substantially preventing loss of the stored charge due to particle radiation.

BRIEF DESCRIPTION OF THE DRAWINGS

Other objects and advantages of the invention will become apparent from the following detailed description when taken in conjunction with the accompanying drawings, in which.

DETAILED DESCRIPTION OF THE INVENTION

Figure 5:
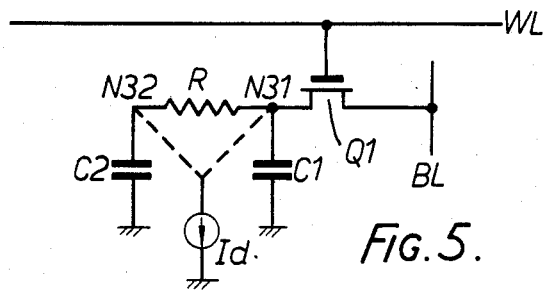
FIG. 5 is an equivalent circuit illustrating a first embodiment of the dynamic memory device in accordance with the invention.

The present invention will now be described in detail according to the various embodiments. FIG. 5 is an equivalent circuit of a first embodiment of the dynamic memory device according to the present invention. As shown, a transistor $Q_1$ is a switch for transferring data between a bit line BL and a memory cell. The transistor gate potential is controlled by a control signal from a word line WL. The memory cell consists of a resistance element R and capacitive elements $C_1$ and $C_2$. One end of the resistance element R and one end of the capacitive element $C_1$ are connected to a memory node $N_{31}$, and the capacitive element $C_2$ is connected to the other end of the resistance element. The other ends of capacitive elements $C_1$ and $C_2$ are connected, respectively, to a reference potential, for example, ground potential.

Figure 4:
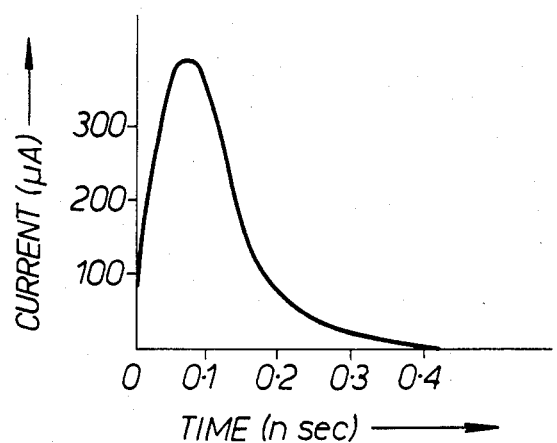

The operation of the dynamic memory device according to the present invention will now be described. Suppose that the memory cell is storing the memory condition "1" (i.e., the nodes $N_{31}$ and $N_{32}$ are maintained at a high potential). If alpha-particles irradiate $N_{31}$, carriers will be generated resulting in the discharge of the charges stored by the capacitive element $C_1$ for a very short time period (i.e., within 0.2 to 0.3 ns as seen from FIG. 4) due to the current Id. Since in a memory device having a high integration level, the charges stored in capacitive element $C_1$ are equal to or lower than the charges due to the current Id, all charges of capacitive element $C_1$ will be discharged in the worst case. However, even if the capacitive element $C_1$ is completely discharged, only a portion of the charges stored in capacitive element $C_2$ will be discharged since its discharge rate depends upon the time constant of $C_2R$. For example, if node $N_{31}$ was completely discharged during $T_d$, the charges lost by node $N_{32}$ are given by $V_0C_2[1-\exp(-t_d/C_2R)]$. If the initial potential at node $N_{32}$ is $V_0$, the charges $Q_0$, which are stored in capacitive elements $C_1$ and $C_2$ before the application of alpha-radiation become $Q_0=V_0(C_1+C_2)$. The total charges $Q_f$ remaining after the application of the radiation is given by:

$$Q_f = Q_0 - V_0C_2[1 - \exp(-t_d/C_2R)] - V_0C_1$$
$$= V_0C_2 \exp(-t_d/C_2R).$$

After the current Id caused by the radiation disappears, residual charges $Q_f$ are distributed to capacitive elements $C_1$ and $C_2$ through resistance element R. Accordingly, all of the stored charges are changed from $Q_0$ to $Q_f$. That is, all of the stored charges are reduced from 1 to $C_2 \exp(-T_d/C_2R)/(C_1+C_2)$. A sensing amplifier circuit will normally not detect a 10% or less change in the charge quantity. Therefore, if the values for resistance element R and capacitive elements $C_1$ and $C_2$ are selected so as to satisfy the expression $C_2 \exp(-t_d/C_2R)/(C_1+C_2) \geq 0.9$, malfunction due to alpha radiation will not occur. For example, if during the time $t_d$ wherein the pulse current Id is generated by alpha radiation and $t_d=0.3$ ns, the capacitance values of elements $C_1$ and $C_2$ should be selected as $C_1=4$ fF and $C_2=50$ fF and the resistance value of element R should be selected as $R=210$ K. In this case, however, it is necessary to position node $N_{32}$ at a location electrically isolated from the substrate because a malfunction will not be prevented if alpha radiation is applied to node $N_{32}$. Further, it is preferable to increase the value of resistance element R. In order to operate the memory cell at high speeds, however, it is necessary not to substantially increase this resistance as compared with the time constant determined by the conductance of transistor $Q_1$ and capacitive elements $C_1$ and $C_2$.

Figure 6:
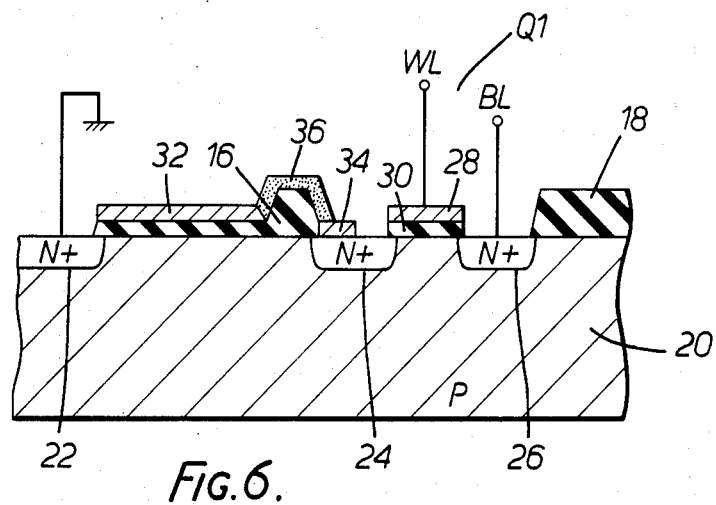
FIG. 6 is a fragmentary sectional view illustrating the first embodiment of the present invention.

Two structural modifications of the first embodiment will now be described with reference to FIGS. 6 and 7. As shown in FIG. 6, isolation regions 16 and 18 having a thickness of 0.7 to 1 μm and composed of $SiO_2$ are provided on a p-type semiconductor substrate 20, for example, a Si substrate. N-type diffused regions 22, 24 and 26 are formed by introducing arsenic or phosphorus into the p-type semiconductor substrate. A gate electrode 28 composed of a polycrystalline silicon or metal silicide layer is provided on a gate insulating film 30 of $SiO_2$ having a thickness of about 350 Å. When the electrodes are made of polycrystaline silicon, one electrode 32 of the capacitive element, an electrode 34 contacting region 24 and a region 36 serving as the resistance element can all be produced at the same time and to a thickness of about 3000 Å. In this case, an impurity is added to regions 32 and 34, but not to region 36 of the resistance element, for the purpose of lower the resistance value.

MOS transistor $Q_1$ is provided by source and drain regions 24 and 26, and gate electrode 28. Capacitive element $C_2$ is provided by both electrode 32 and an inversion layer just under the electrode 32. Capacitive element $C_1$ is constituted by a stray capacitance of the source region 24. Preferably, this stray capacitance should be sufficiently low.

Although the resistance element R may be locally provided in region 36, it is possible to distribute it within electrodes 32 and 34, and region 36. In addition, an impurity having an opposite conductivity to that of the semiconductor substrate may be introduced into the semiconductor substrate just under electrode 32 so as to increase the capacitance of capacitive element $C_2$.

Figure 7:
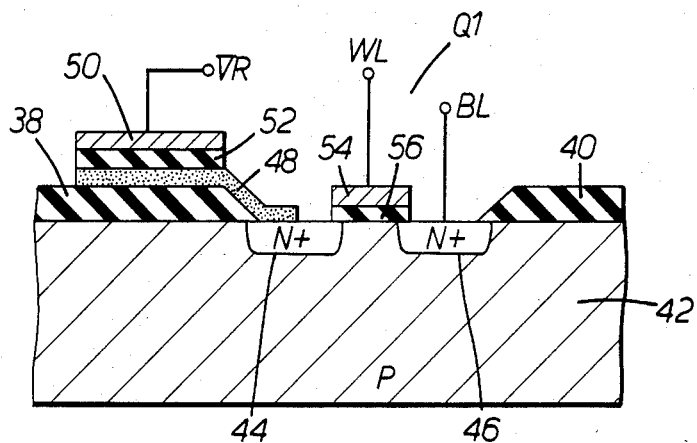
FIG. 7 is a fragmentary sectional view of a modification of the embodiment shown in FIG. 6.

FIG. 7 shows isolation regions 38 and 40, composed of $SIO_2$, having a thickness of 0.7 to 1 μm and provided on p-type semiconductor substrate 42. N-type diffused regions 44 and 46 are produced by introducing arsenic or phosphorus into the semiconductor substrate. A distributed resistance element region 48, composed of a polycrystalline silicon layer having a thickness, for example, of approximately 3000 Å, is formed on the isolation region 38. Capacitor $C_2$ consists of region 48, a wiring layer 50 and an insulating film 52. Wiring layer 50 is deposited to a thickness of about 3000 Å on insulating film 52 consisting of, for example, $SiO_2$, $Si_3N_4$, or $TaO_2$ and having a thickness of approximately 500 Å. MOS transistor $Q_1$ consists of a gate electrode 54 formed on a gate insulating film 56, having a thickness of approximately 350 Å, with source and drain regions 44 and 46.

The operation of the structures shown in FIGS. 6 and 7 will now be explained. The transfer of data is carried out through the word line WL by using MOS transistor $Q_1$. The input and output of data are accomplished by the bit line BL. In the structure of FIG. 6, the entering signal charge is supplied to the capacitive element formed by electrode 32 from the stray capacitance of the source region 24 via resistance element 36 and the inversion layer produced just under the electrode 32. When alpha radiation is applied near the source region 24, the charges stored in the stray capacitance are lost since the incident radiation generates charges mainly within the semiconductor substrate. However, the charges formed by the radiation does not effect the charges stored in the capacitance formed by the inversion layer. Accordingly, a malfunction will not occur in the memory cell. The structure of FIG. 7 operates in a similar manner. Furthermore, the dynamic memory cell of FIG. 7 is suitable for high packing density because the resistance element R and the capacitive element $C_2$ can be produced in the form of a multilayered structure. In FIG. 6, the earth potential is connected to region 22 as a reference potential. In FIG. 7, however, various electric potentials can be applied to wiring layer 50, such as a threshold voltage from a MOS transistor, a power supply voltage (e.g., 5 V), or an earth potential.

A second embodiment of a dynamic memory device according to the present invention will be described with reference to FIGS. 8-10. A memory cell consists of a transistor $Q_1$, capacitive elemnts $C_1$ and $C_2$, and a resistance element R. One end of element R is connected to capacitive element $C_2$. A signal charge is controlled by a word line WL, and the input and output of data are carried out through a bit line BL. Reference potentials, for example, ground potential or power supply voltage are respectively connected to the capacitive element $C_1$ and the other end of the resistance element. This embodiment is different from the first embodiment in that resistance element R is connected to memory node $N_{31}$ through capacitive element $C_2$. The operation of this memory cell is the same as that described with respect to the first embodiment.

Figure 8:
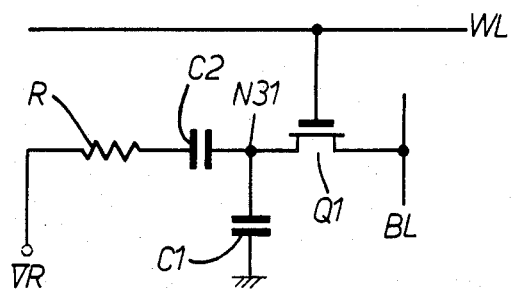
FIG. 8 is an equivalent circuits illustrating a second embodiment of the dynamic memory device in accordance with the invention.
Figure 9:
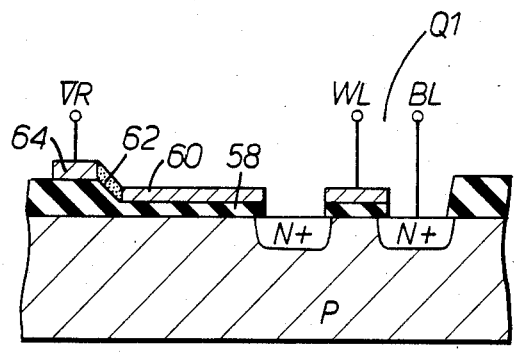
FIG. 9 is a fragmentary sectional view illustrating the second embodiment of the present invention.
Figure 10:
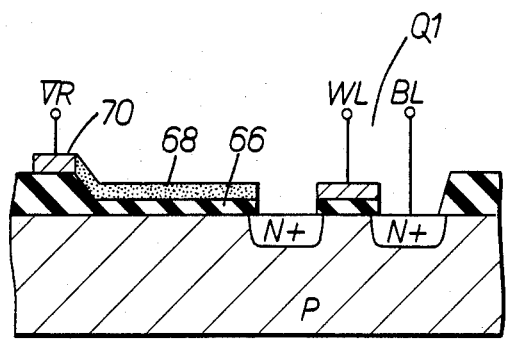
FIG. 10 is a fragmentary sectional view of a modification of the embodiment shown in FIG. 9.

FIGS. 9 and 10 are structural modifications of the equivalent circuit shown in FIG. 8. In FIGS. 9 and 10, the portions of a transistor $Q_1$ are identical to those of the transistor shown in FIGS. 6 and 7. In FIG. 9, the capacitive element $C_2$ is provided by an $SiO_2$ insulating film 58 having a thickness of about 350 Å, and an opposite facing electrode 60 consisting of a low resistivity polycrystalline silicon layer having a thickness of approximately 3000 Å. A resistance element 62 is positioned adjacent one end of opposite electrode 60 and comprises, for example, a high resistivity polycrystalline silicon layer having a thickness of about 3000 Å. Further, a reference potential $V_R$ is supplied to an electrode 64 which has one end contiguous to the other end of resistance element 62. In FIG. 10, capacitive element $C_2$ consists of an $SiO_2$ insulating film 66 having a thickness of about 350 Å, and an opposite facing electrode 68 consisting of a high resistivity polycrystalline silicon layer having a thickness of approximately 3000 Å. An electrode 70 to which a reference voltage $V_R$ is applied is positioned so that one end is continguous to one end of opposite electrode 68. As shown in FIG. 10 the resistance element 68 is distributed over the insulating film 66. As discussed regarding the first embodiment, reference potential $V_R$ can be supplied from a power supply (e.g., 5 V), an earth potential, a substrate potential, or a threshold voltage from a MOS transistor.

Figure 1:
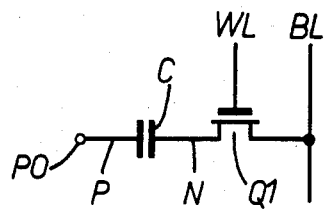
FIG. 1 is an equivalent circuit of a conventional dynamic memory device.
Figure 2:
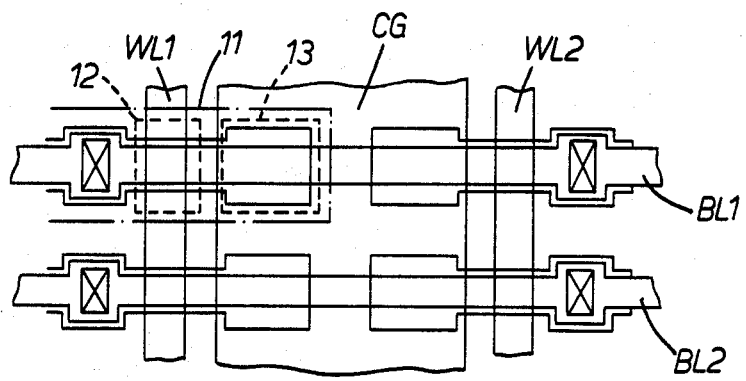
FIG. 2 is a plan view of a pattern layout of the circuit shown in FIG. 1.
Figure 3:
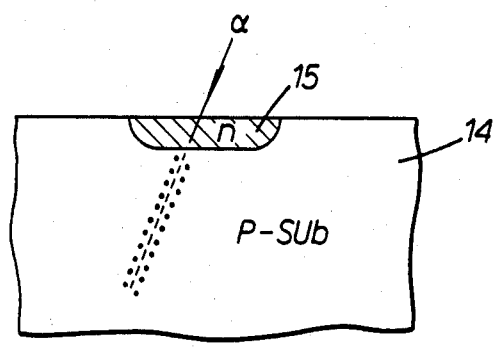
FIGS. 3 and 4 are a fragmentary sectional view and a graph, respectively, for explaining the funnelling effect caused by particle radiation.
Figure 11:
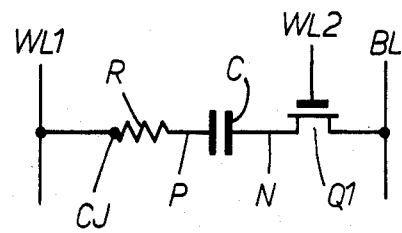
FIG. 11 is an equivalent circuit illustrating a third embodiment of the dynamic memory device in accordance with the invention.
Figure 12:
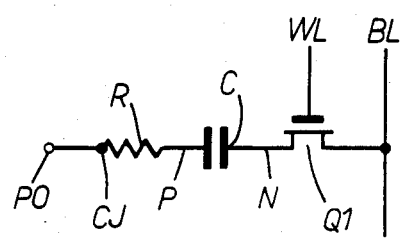
FIG. 12 is an equivalent circuit illustrating a fourth embodiment of the present invention.

The third and fourth embodiments of the present invention will now be described with reference to FIGS. 11-15. FIGS. 11 and 12 show a structure wherein the electrode P opposite to memory node N in the circuit of FIG. 1 consists of a high resistance wiring layer R and is connected to the word $WL_1$ of an adjacent line or power supply note $P_o$, respectively. The time constant CR, given by high resistance wiring layer R and memory node capacitance C is set so as to satisfy the relationship $CR > t_d$ (i.e., the funnelling time constant).

Figure 13:
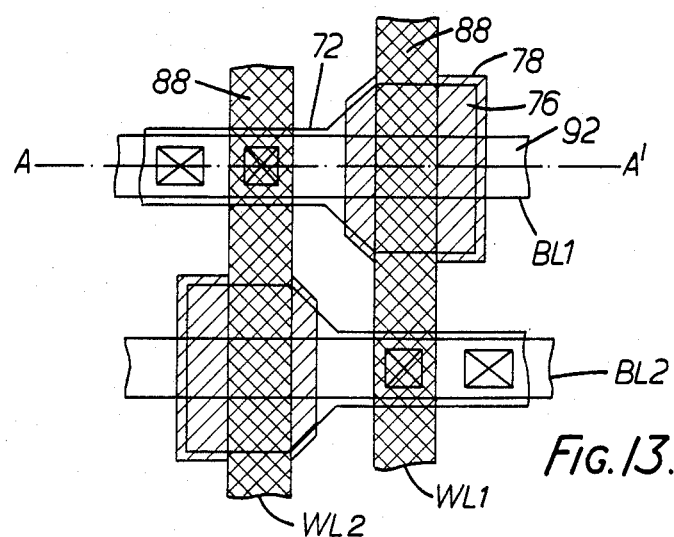
FIG. 13 is a fragmentary plane view of the third embodiment of the present invention.
Figure 14:
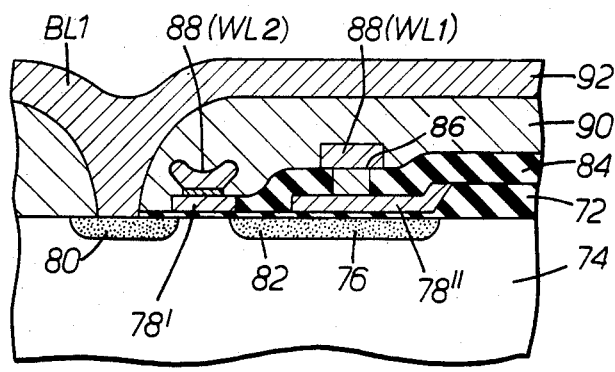
FIG. 14 is a fragmentary sectional view of the third embodiment of the invention shown in FIG. 13.

FIGS. 13 and 14 show the pattern layouts of the third embodiment illustrated in FIG. 11; FIG. 13 is a plane view and FIG. 14 is a cross-sectional view taken along the line A—A' of FIG. 13. After forming an isolation region 72 on a semiconductor substrate 74, impurity ions are implanted into a capacitor portion 76 to provide an n+ region. Capacitor portion 76 corresponds to memory node N of FIG. 11. After a gate insulating film is formed on the substrate surface, a high resistance polysilicon layer 78 is deposited thereon and is patterned to provide both a transfer gate 78' and a capacitor gate 78''. Thus, capacitive element C consists of portions 72, 76 and 78''. Portion 78'' corresponds to electrode P of FIG. 11 and also includes resistance layer R of FIG. 11. Using the polysilicon layer 78 as a mask, impurity ions are selectively implanted into the substrate to form source and drain regions 80 and 82 of a switching MOS transistor. After producing an insulation film layer 84, a contact junction 86 is made near portion 78''', and a low resistance polysilicon layer 88 is deposited and patterned on film layer 84 and layer 78 of the transfer gate thereby forming parallel spaced word lines $WL_1$ and $WL_2$. Contact junction 86 corresponds to CJ in FIG. 11. Thereafter, a layer insulation film 90 is formed on the second polysilicon layer 88 and the bit line $BL_1$ is formed by applying an aluminum interconnection layer 92. Bit line $BL_1$ has a contact junction with region 80.

Figure 15:
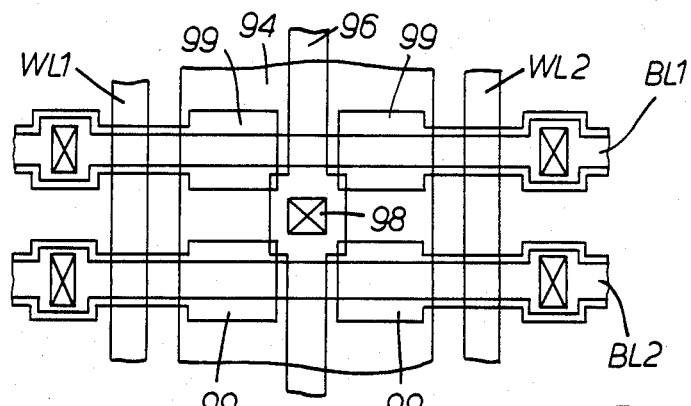
FIGS. 15 to 17 are respective plan views illustrating separate modifications of the fourth embodiment of the present invention.

FIG. 15 shows a pattern layout of FIG. 12. As shown, $WL_1$ and $WL_2$ are adjacent word lines, $BL_1$ and $BL_2$ are adjacent bit lines, 94 is an opposite electrode of the cell (i.e., a high resistance layer), 96 is a low resistance wiring layer, and 98 is a contact junction between opposite electrode 94 and low resistance wiring layer 96. In this structure, the resistor R of FIG. 12 is distributed along the first high resistance layer. Portions 99 correspond to the memory node N of FIG. 12, electrode 94 corresponds to electrode P and resistance R of FIG. 12, and layer 96 is coupled to a power supply and corresponds to the portion of FIG. 12 between $P_o$ and R.

Figure 16:
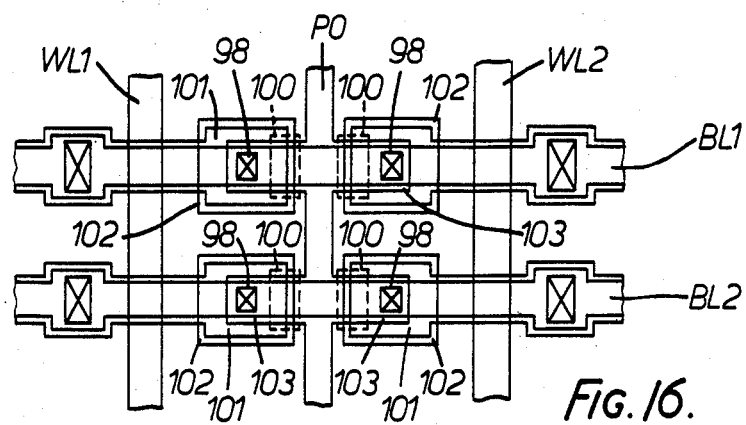

The present invention will not be limited to the described embodiments, it is clearly possible to embody the invention by other modifications. For example, the present invention may be employed in the structure of FIG. 16. FIG. 16 shows a plane view of another pattern layout of the circuit of of FIG. 12; however, this layout has the contact junction CJ between R and Po of FIG. 12. Separate memory cells are formed along a power supply line $P_o$ on either side. An opposite electrode 101 of capacitor C is formed which is separated from a high resistance layer 102 forming the other electrode of the capacitor for each of the cells, and power supply line $P_o$ is formed using a polysilicon layer to create a low resistance layer. Impurity ions for forming the high resistance portions are implanted into the polysilicon layer by using the broken line portions 100 as masks. The low resistance lines $P_o$ include a low resistance portion 103 which is connected to high resistance portion 102 and 100 via contact junction 98. According to this structure, since the broken line portions 100 and 102 have a high resistivity, an effect similar to the above-described embodiments can be obtained. The reference power supply lines $P_o$ are formed entirely by the low resistance wiring layers; if desired, the contact resistance of the junctions 98 between capacitor C and the power supply lines may be made high to achieve the same effect. Thus, layer 101 corresponds to memory node N of FIG. 12, and portions 100 and 102 correspond to electrode P.

Figure 17:
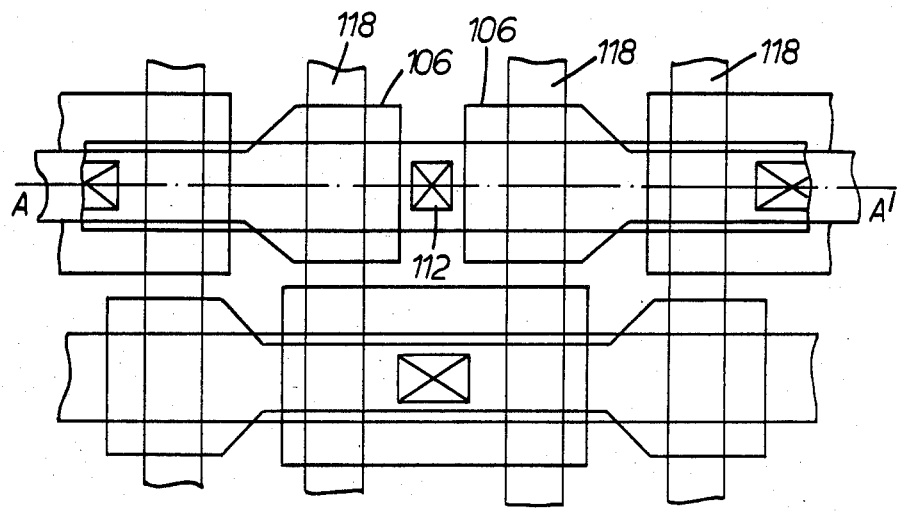
Figure 18:
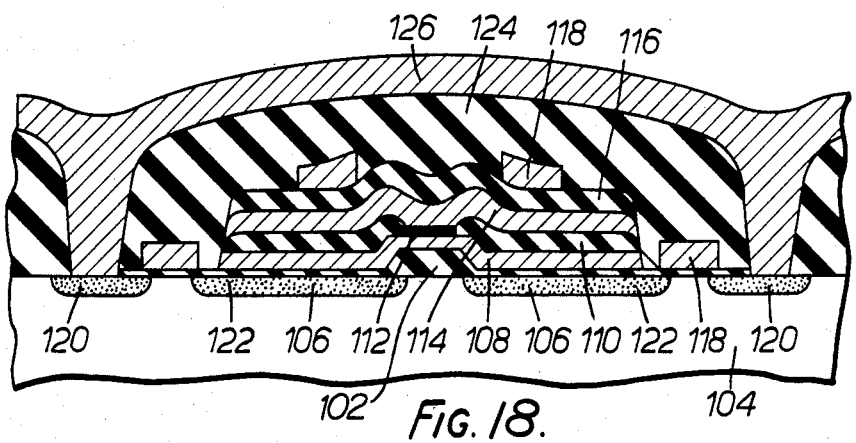
FIG. 18 is a fragmentary sectional view taken along line A—A' of FIG. 17.

FIGS. 17 and 18 shows the pattern layouts of a further modification of the circuit of FIG. 12, wherein FIG. 17 is a plane view and FIG. 18 is a cross-sectional view taken along the line A—A' of FIG. 12. Like FIG. 16, FIG. 17 has a contact junction between R and Po of FIG. 12. An isolation region 102 is formed on a semiconductor substrate 104, and impurity ions are implanted into a capacitor portion 106 to provide an n+ region. A high resistance polysilicon layer 108 is deposited on the substrate surface, and a layer insulation film 110 is provided after patterning the polysilicon layer. After a contact junction 112 is formed in the layer insulation film 110, a low resistance polysilicon layer 114 is deposited and patterned. Although the first and second polysilicon layers 108 and 114 are shown to have the same pattern, this is not always necessary. A layer insulation film 116 is then formed on polysilicon layer 114, and a further low resistance polysilicon layer 118 is deposited on insulation film layer 116. Thereafter, impurity ions are selectively implanted into source and drain portions 120 and 122 of switching MOS transistor $Q_1$. An insulation film layer 124 is formed on polysilicon layer 118, and a contact junction is formed with portions 120 by applying an aluminum wiring layer 126. Capacitor portion 106 corresponds to memory node N of FIG. 12, high resistance layer 108 corresponds to electrode P, while low resistance layer 114 corresponds to the lead portion including resistance R and power supply node $P_o$. Contact junction 112 corresponds to junction CJ of FIG. 12.

Figure 19:
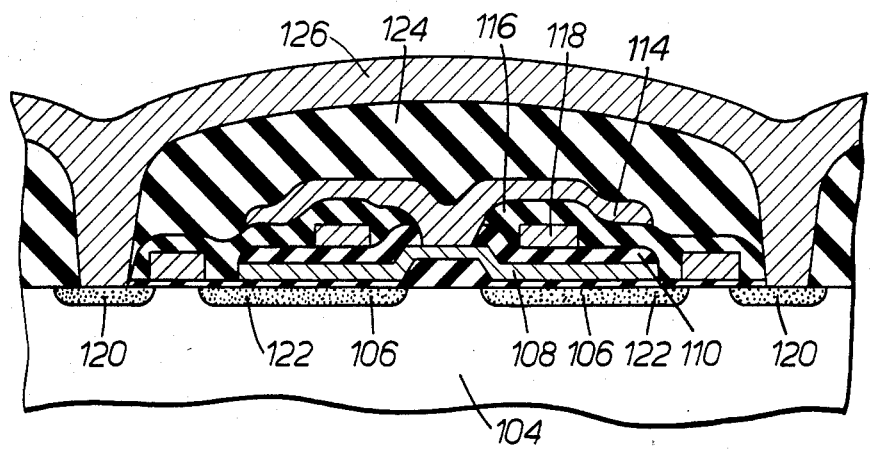
FIG. 19 is a fragmentary sectional view of a modification of the invention taken along line A—A' of FIG. 17.

The present invention is not limited to the above described embodiments, it is also possible to incorporate other various modifications. For example, the present invention may be constructed as shown in FIG. 19. FIG. 19 shows a cross-sectional view of another modification of the circuit illustrated in FIG. 12, wherein the order of polysilicon layer 114 and polysilicon layer 118 are reversed. As shown, the same components as those of FIG. 18 are represented by the same numerals and, therefore, further explanation is omitted. Similar operation and effect to the previously described embodiment is obtained by the structure of FIG. 19.

The operation of the above-described structures will now be explained. If the memory cell is at a "1" state (i.e., the node N is at a high level) and alpha radiation is applied to node N, it collects electrons during an extremely short time period and node N changes its level to a low level. At that time, the potential of the opposite electrode P is reduced, due to capacitive coupling with node N, and then begins to recover slowly, during time constant CR, to level of the word line WL'. The charge of the memory node is lost by this relaxation process. During an extremely short time period as compared with time constant CR, the opposite electrode may be regarded as in a floating condition, and the stored charge of capacitor C decreases as current flows through resistor R. On the one hand, after the short time period $t_d$ (i.e., 0.2 to 0.3 n sec) electrons caused by the radiation are no longer collected. Accordingly, since alpha radiation generated current does not flow into node N, further loss of charge does not occur. Consequently, the stored charge is lost only in accordance with the CR time constant during the time period $t_d$. Consequently, the loss of stored charges can be greatly reduced by properly selecting the value for resistor R.

Figure 20:
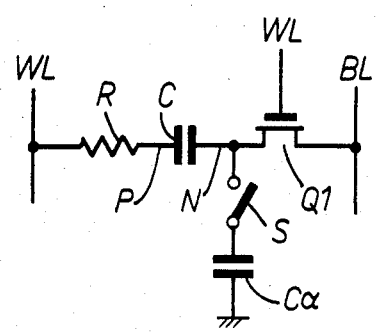
FIG. 20 is an equivalent circuit for explaining the operation of the third embodiment.
Figure 21:
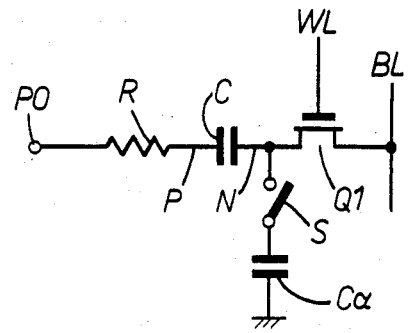
FIG. 21 is an equivalent circuit for explaining the operation of the fourth embodiment.
Figure 22:
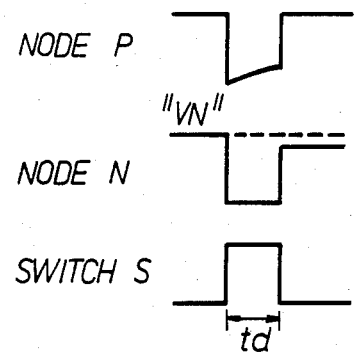
FIG. 22 shows operating waveforms for explaining the operation of the present invention when alpha-radiation is applied.

This operation is more clearly described by reference to the circuits of FIGS. 20 and 21. As shown, generation of carriers due to alpha radiation and the effect of their collection are represented by a capacitor C and a switch S. Capacitor C corresponds to the charge generated by alpha radiation and the switch S is closed only during the time period $t_d$ and opened thereafter. The operating waveforms are shown in FIG. 22. If alpha-rays are applied to node N, carriers are produced so that a charge in order of 100 fC is stored in capacitor C and switch S is closed. At this time, although both nodes N and P are immediately reduced to a low level, the charge stored in the cell is not yet lost. Although node P begins to recover according to time constant CR, the switch S is opened after the time $t_d$ and the transfer of charge does not occur. In the process described above, the final potential at the node N is lowered by $V_N[1-\exp(-t_d/CR)]$ wherein the intial potential is given by $V_N$. Thus, the final potential is not sufficiently lowered if the relation of $CR > t_d$ is maintained. Accordingly, soft errors due to the incidence of alpha radiation can be substantially prevented.

According to this present invention, even if alpha-rays are applied to the memory device, the malfunction caused by alpha radiation can be prevented because the resistance element and the capacitive element are connected in cascade with the data memory node and the charges stored in the capacitive element are not instantaneously discharged. Rather, the time constant of the discharge is determined by the resistance element and the capacitive element. Further, it is possible to accomplish high packing density for desirable high level integration since the capacitive and resistive elements can be provided in the form of a multilayered structure.

What is claimed is:

1. A dynamic memory device formed in an integrated semi-conductor substrate and subjected to particle radiation comprising:
   a switching transistor having a switching terminal, an input-output terminal and a memory terminal;
   a bit line coupled to said input-output terminal for supplying a charge to said transistor;
   a word line coupled to said switching terminal for controlling the switching of said transistor;
   a resistance-capacitance circuit means, coupled to said memory terminal and comprising a resistor and a charge store capacitor and having a time constant which is greater than the funnelling time constant of the particle radiation, for storing the charge supplied from said bit line and for substantially preventing loss of the stored charge due to said particle radiation; and
   a potential reference coupled to said resistance-capacitance circuit means.

2. The dynamic memory device of claim 1 wherein said potential reference is a power supply.

3. The dynamic memory device of claim 1 wherein said potential reference is the potential supplied by a word line of an adjacent memory device.

4. The dynamic memory device of claim 1 wherein said potential reference is ground potential.

5. The dynamic memory device of claim 1 wherein said capacitor comprises an electrode formed by a high resistance wiring layer and is coupled to the potential supplied by a word line of an adjacent memory device.

6. The dynamic memory means device of claim 1 wherein said capacitor comprises an electrode formed by a high resistance wiring layer which is electrically isolated from said substrate.

7. The dynamic memory device of claim 1 wherein said resistor and charge store capacitor are connected in series.

8. The dynamic memory device of claim 1 wherein one terminal of said resistor is connected to said memory terminal and the other terminal is connected to said charge store capacitor.

9. The dynamic memory device of claim 1 wherein one terminal of said charge store capacitor is connected to said memory terminal and the other terminal is connected to said resistor.

10. The dynamic memory device of claim 7 wherein said potential reference is a power supply.

11. The dynamic memory device of claim 7 wherein said potential reference is the potential supplied by a word line of an adjacent memory device.

12. The dynamic memory device of claim 7 wherein said potential reference is ground potential.

13. The dynamic memory device of claim 7 wherein said capacitor comprises an electrode formed by a high resistance wiring layer and is coupled to the potential supplied by a word line of an adjacent memory device.

14. The dynamic memory means device of claim 7 wherein said capacitor comprises an electrode formed by a high resistance wiring layer which is electrically isolated from said substrate.

15. A dynamic memory device formed in an integrated semi-conductor substrate and subjected to particle radiation comprising:
    a switching transistor having a switching terminal, an input-output terminal and a memory terminal;
    a bit line coupled to said input-output terminal for supplying a charge to said transistor;
    a word line coupled to said switching terminal for controlling the switching of said transistor;
    a resistance-capacitance circuit means, coupled to said memory terminal and comprising a resistor and a charge store capacitor which comprises an electrode formed by a high resistance wiring layer, for storing the charge supplied from said bit line and for substantially preventing loss of the stored charge due to said particle radiation;
    a potential reference coupled to said resistance-capacitance circuit means; and
    a low resistance wiring layer coupled to said high resistance wiring layer for supplying said reference potential to said capacitor electrode.

16. The dynamic memory device of claim 15 wherein said capacitor electrode is electrically isolated from said substrate.

17. The dynamic memory device of claim 15 wherein said potential reference is a power supply.

18. The dynamic memory device of claim 15 wherein said potential reference is the potential supplied by a word line of an adjacent memory device.

19. The dynamic memory device of claim 15 wherein said potential reference is ground potential.

20. The dynamic memory device of claim 15 wherein said capacitor comprises an electrode formed by a high resistance wiring layer and is coupled to the potential supplied by a word line of an adjacent memory device.

* * * * *